United States Patent
Lee et al.

(10) Patent No.: US 11,599,017 B2
(45) Date of Patent: Mar. 7, 2023

(54) OPTICAL PROXIMITY CORRECTION METHOD AND METHOD OF FABRICATING MASK INCLUDING THE SAME

(71) Applicant: SAMSUNG ELECTRONICS CO., LTD., Suwon-si (KR)

(72) Inventors: Soo Yong Lee, Yongin-si (KR); Seo Rim Moon, Seoul (KR); Kyung Jae Park, Hwaseong-si (KR); Soo Ryong Lee, Seoul (KR); Kang-Min Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 16/952,330

(22) Filed: Nov. 19, 2020

(65) Prior Publication Data
US 2021/0325773 A1 Oct. 21, 2021

(30) Foreign Application Priority Data
Apr. 20, 2020 (KR) ........................ 10-2020-0047235

(51) Int. Cl.
*G03F 1/36* (2012.01)
*H01L 21/027* (2006.01)
*G03F 7/20* (2006.01)

(52) U.S. Cl.
CPC ............ *G03F 1/36* (2013.01); *G03F 7/70441* (2013.01); *H01L 21/0274* (2013.01)

(58) Field of Classification Search
CPC ........ G03F 1/36; G03F 7/705; G03F 7/70191; G03F 7/70625; G03F 7/70441; G03F 7/70558; G03F 2119/18; G03F 30/398; H01L 21/0274
See application file for complete search history.

(56) References Cited

U.S. PATENT DOCUMENTS

| | | | |
|---|---|---|---|
| 5,557,314 A * | 9/1996 | Okamoto | B82Y 10/00 347/230 |
| 6,687,895 B2 | 2/2004 | Zhang | |
| 6,787,459 B2 * | 9/2004 | Moniwa | G03F 1/70 430/394 |
| 7,487,489 B2 | 2/2009 | Granik | |
| 7,669,172 B2 * | 2/2010 | Ito | G03F 1/00 716/54 |
| 7,730,445 B2 * | 6/2010 | Nojima | G06F 30/398 716/55 |
| 7,735,053 B2 * | 6/2010 | Harazaki | G03F 1/36 716/53 |
| 7,984,392 B2 | 7/2011 | Fu | |
| 7,996,794 B2 * | 8/2011 | Kobayashi | G06F 30/39 716/51 |
| 8,214,775 B2 * | 7/2012 | Gergov | G03F 1/68 716/55 |

(Continued)

FOREIGN PATENT DOCUMENTS

KR 10-2011-0001141 A 1/2011

*Primary Examiner* — Helen Rossoshek
(74) *Attorney, Agent, or Firm* — Lee IP Law, P.C.

(57) ABSTRACT

An optical proximity correction method includes extracting first patterns from a pattern mask, performing lithography on at least a part of the first patterns to form first-first patterns, forming the first-first patterns at positions where the first patterns are formed, and performing correction on the pattern mask on which the first-first patterns are formed.

18 Claims, 13 Drawing Sheets

(56) References Cited

U.S. PATENT DOCUMENTS

| | | | |
|---|---|---|---|
| 8,392,854 B2 | 3/2013 | Kim et al. | |
| 8,627,241 B2* | 1/2014 | Wang | G06F 30/39 |
| | | | 716/54 |
| 9,250,538 B2 | 2/2016 | Ning et al. | |
| 9,658,524 B2* | 5/2017 | Misaka | G03F 1/50 |
| 9,747,408 B2 | 8/2017 | Huang et al. | |
| 11,238,208 B2* | 2/2022 | Yeo | H01L 21/0274 |
| 2009/0061362 A1* | 3/2009 | Taoka | G03F 7/70466 |
| | | | 430/319 |
| 2012/0198404 A1* | 8/2012 | Hasebe | G03F 7/70441 |
| | | | 716/112 |
| 2012/0237859 A1* | 9/2012 | Yang | G03F 1/84 |
| | | | 430/5 |
| 2013/0010100 A1* | 1/2013 | Kotaki | H01L 22/12 |
| | | | 348/80 |
| 2013/0070222 A1 | 3/2013 | Fujimura | |
| 2013/0275925 A1* | 10/2013 | Wang | G06F 30/39 |
| | | | 716/53 |
| 2020/0249578 A1* | 8/2020 | Hsu | G03F 7/70091 |
| 2020/0363713 A1* | 11/2020 | Hsu | G03F 1/36 |
| 2021/0048753 A1* | 2/2021 | Zhang | G03F 1/36 |
| 2021/0216697 A1* | 7/2021 | Van Den Brink | G06F 30/392 |
| 2022/0050381 A1* | 2/2022 | Biswas | G03F 7/70625 |

\* cited by examiner

OPTICAL PROXIMITY CORRECTION METHOD AND METHOD OF FABRICATING MASK INCLUDING THE SAME

CROSS-REFERENCE TO RELATED APPLICATION

Korean Patent Application No. 10-2020-0047235, filed on Apr. 20, 2020, in the Korean Intellectual Property Office, and entitled: "Optical Proximity Correction Method and Method of Fabricating Mask Including the Same," is incorporated by reference herein in its entirety.

BACKGROUND

1. Field

The present disclosure relates to an optical proximity correction method and a method of fabricating a mask including the same.

2. Description of the Related Art

In general, a photolithography technique is a fundamental technique that leads to high integration of semiconductor devices by forming semiconductor patterns on a wafer, e.g., a semiconductor substrate, using light. For example, in photolithography, a photoresist, i.e., a material having varying solubility in accordance with exposure light irradiated thereon, e.g., ultraviolet rays, electron beams or X-rays, may be coated on the semiconductor substrate at a position where a pattern is to be formed, e.g., of a semiconductor film, an insulating film, a conductive film or the like, predetermined portions of the photoresist may be exposed to light by using a photomask, and then the exposed portions of the photoresist, which represent high solubility in response to a developing solution, may be removed, thereby forming a photoresist pattern. Portions of, e.g., the semiconductor film, the insulating film, the conductive film or the like, on the semiconductor substrate, which are exposed through the photoresist pattern, may be removed by an etching process, thereby forming a desired pattern, e.g., a semiconductor pattern, on the semiconductor substrate.

For example, an electron beam device may be used as an exposure device using a photomask for forming the photoresist pattern. However, an electron beam emitted from the electron beam device may be scattered in the photoresist and its underlying layers, thereby affecting a critical dimension (CD) and fidelity of the photoresist pattern and the resultant semiconductor pattern. That is, the electron beam exposure method is a method of directly exposing actual photoresist through a photomask, rather than a method of performing exposure, e.g., by a stepper using a reticle as a medium.

For example, in the electron beam exposure method, an area to be exposed is divided into small pixels, and pixels corresponding to pattern data may be filled by the electron beam in accordance with the pixel size. However, as the integration density of a semiconductor device increases, improvement effects of both a depth of focus and a resolution may decrease in irregularly arranged patterns commonly found in logic devices, e.g., microprocessors.

For example, when a pattern having a numerical value close to a resolution limit is formed, an optical proximity effect may occur, i.e., a pattern actually formed on a semiconductor substrate differs from a design pattern. Due to the difference between the design pattern and the actually formed pattern, the performance of a device may significantly deteriorate, e.g., compared to the performance expected from the design. Accordingly, an optical proximity correction (OPC) is performed in response to the pattern difference, i.e., distortion phenomenon, which occurs at the resolution limit in the photolithography process, in order to adjust, e.g., compensate for, the difference, thereby properly completing a fine pattern of a photomask on a wafer, as designed.

SUMMARY

According to an aspect of embodiments, there is provided an optical proximity correction method including extracting first patterns from a pattern mask; performing lithography on at least a part of the first patterns to form first-first patterns; forming the first-first patterns at positions where the first patterns are formed; and performing correction on the pattern mask on which the first-first patterns are formed.

According to an aspect of embodiments, there is provided an optical proximity correction method including extracting first patterns and second patterns from a pattern mask; performing lithography on at least a part of the first patterns to form first-first patterns; performing lithography on at least a part of the second patterns to form second-first patterns; forming the first-first patterns at positions where the first patterns are formed; forming the second-first patterns at positions where the second patterns are formed; performing correction on the pattern mask on which the first-first patterns and the second-first patterns are formed.

According to an aspect of embodiments, there is provided a method of fabricating a mask, including producing a pattern mask with a designed layout, performing lithography on at least a part of first patterns in the pattern mask to form first-first patterns, forming the first-first patterns at positions where the first patterns are formed; performing a correction on the pattern mask on which the first-first patterns are formed to correct an optical proximity effect; and performing a mask tape-out (MTO) on the pattern mask in which the optical proximity effect has been corrected.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, an optical proximity correction method according to some embodiments will be described with reference to FIGS. 1 through 13.

Figure 1:
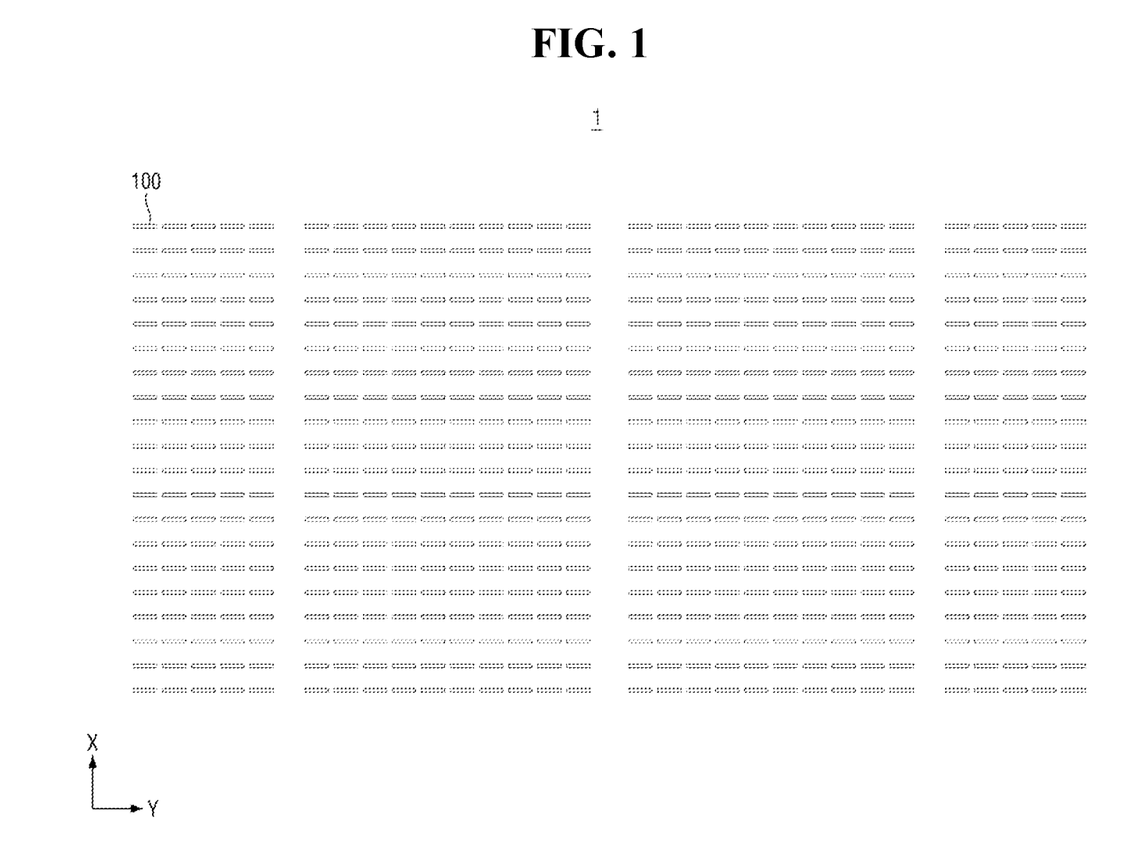
FIG. 1 illustrates a plurality of patterns including target patterns before lithography is performed.

FIG. 1 exemplarily illustrates a plurality of patterns including target patterns before lithography is performed.

Referring to FIG. 1, a plurality of preliminary patterns 1 may be formed on a substrate. The plurality of preliminary patterns 1 may include a plurality of preliminary target patterns 100 on the substrate to be subjected to lithography. For example, as illustrated in FIG. 1, the plurality of preliminary target patterns 100 may be spaced apart from each other, e.g., in a matrix pattern along the X and Y directions. The preliminary target patterns 100 may include two or more materials having different structures formed under a mask. However, the present disclosure is not limited thereto, and the preliminary target patterns 100 may include only one material.

As the preliminary target patterns 100 become fine, an optical proximity effect (OPE) may occur due to the influence between neighboring preliminary target patterns 100 during the lithography process. In order to overcome such a drawback, i.e., the OPE, it is necessary to suppress the occurrence of the OPE by correcting pattern layouts on the mask, which are transferred to form the preliminary target patterns 100.

The lithography described below is assumed to be inverse lithography technology (ILT). However, the lithography used in an optical proximity correction method according to some embodiments is not limited to the ILT.

The ILT described below may be performed with respect to all of the preliminary patterns 1 including the preliminary target patterns 100. A description will be given, with reference to FIG. 2, of a state after performing the ILT with respect to all of the preliminary patterns 1 including the preliminary target patterns 100.

Figure 2:
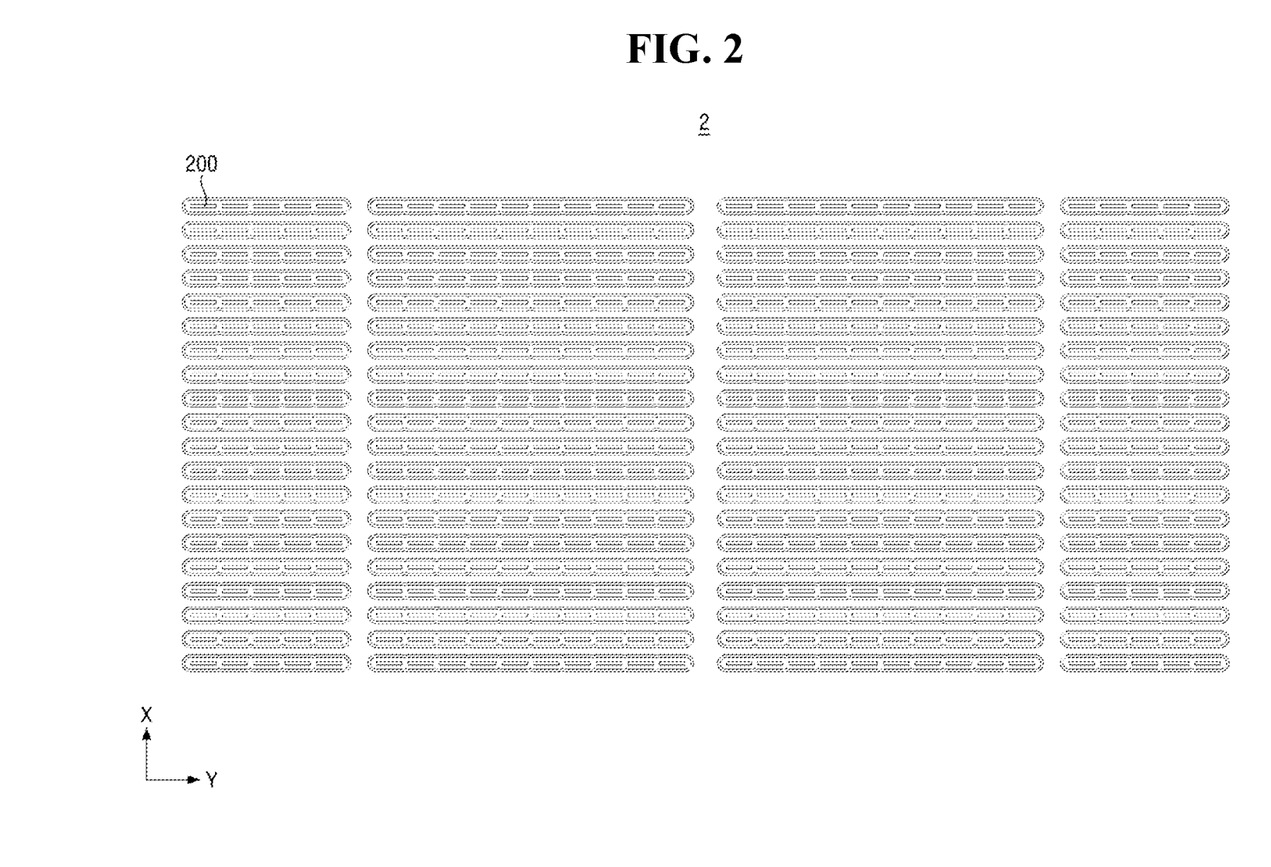
FIG. 2 illustrates a plurality of patterns including target patterns on which lithography has been performed.

FIG. 2 illustrates a plurality of patterns including target patterns on which lithography has been performed.

Referring to FIG. 2, after performing the lithography on all of the preliminary patterns 1 including the preliminary target patterns 100 of FIG. 1, a plurality of patterns 2 including target patterns 200 may be formed, which have been subjected to the lithography. That is, after performing the lithography on all of the preliminary patterns 1 including the preliminary target patterns 100 of FIG. 1, the preliminary target patterns 100 may be transformed into the target patterns 200, respectively, which have undergone lithography. In this case, the lithography is performed on all of the preliminary patterns 1 including the preliminary target patterns 100 of FIG. 1, so that a database of an optical proximity correction (OPC) can be generated in various manners regardless of a topography effect on each pattern.

In general, when lithography is performed on all of the preliminary patterns including the preliminary target patterns, resources (e.g., electric power, etc.) may be excessively consumed during the process of performing the OPC method. In addition, since mask shapes for the preliminary target patterns may be different from each other, the resultant target patterns obtained after performing the lithography may deteriorate in consistency.

Accordingly, in the OPC method according to embodiments, lithography is performed by extracting repeated target patterns, e.g., as opposed to on all the patterns, thereby preventing the excessive resource waste and improving the consistency of the target patterns obtained after performing the lithography. Hereinafter, the OPC method and a method of fabricating a mask including the same according to some embodiments will be described. It is further noted that extracted patterns refer to a portion of patterns from a repetitive pattern and may be set as a minimum repetition unit or a range extended from the minimum repetition unit.

Figure 3:
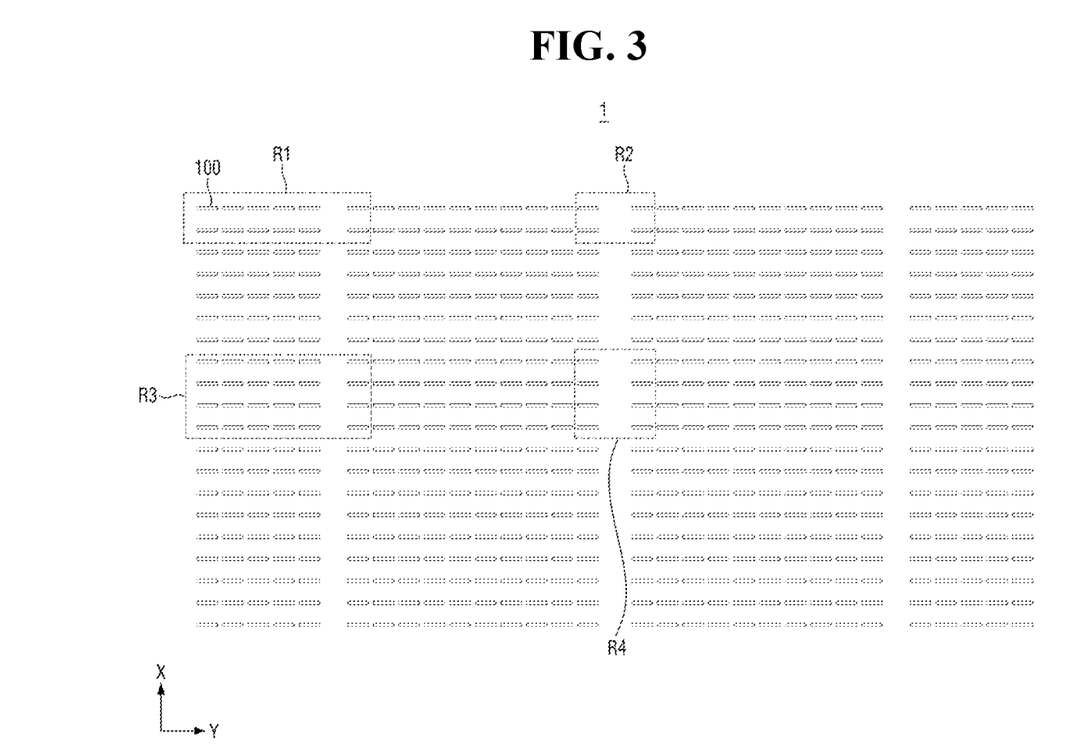
FIG. 3 illustrates extracting patterns of some regions according to the optical proximity correction method in accordance with some embodiments, before lithography is performed.

FIG. 3 illustrates pattern extraction of some regions among the plurality of preliminary target patterns 100 of FIG. 1 in an OPC method in accordance with some embodiments, before lithography is performed.

Referring to FIG. 3, respective regions having repeated unique patterns may exist in the preliminary patterns 1 including the preliminary target patterns 100 to be subjected to lithography. For example, such regions may be determined by visual observation or computer software, e.g., to retarget lithography. For example, as illustrated in FIG. 3, patterns in first through fourth regions R1 through R4 may be extracted, e.g., separated from other patterns via a mask or via a computer simulation.

For example, the preliminary target patterns 100 of a first region R1, a second region R2, a third region R3, and a fourth region R4 may have different patterns, e.g., different spacing or pattern arrangements within each of the regions. For example, patterns of the preliminary target patterns 100 within each of the first through fourth regions R1 through R4 may be the same, e.g., have a same shape.

Subsequently, as will be described in more detail below with reference to FIGS. 5-13, the lithography may be performed only on regions (e.g., the first region R1, the second region R2, the third region R3 and/or the fourth region R4) having the preliminary target patterns 100 which have the same unique patterns by the OPC method according to some embodiments. For example, the lithography may be performed only on the first through fourth regions R1 through R4 of FIG. 3, e.g., rather than on all of the preliminary target patterns 100, as will be described in more detail below.

Figure 4:
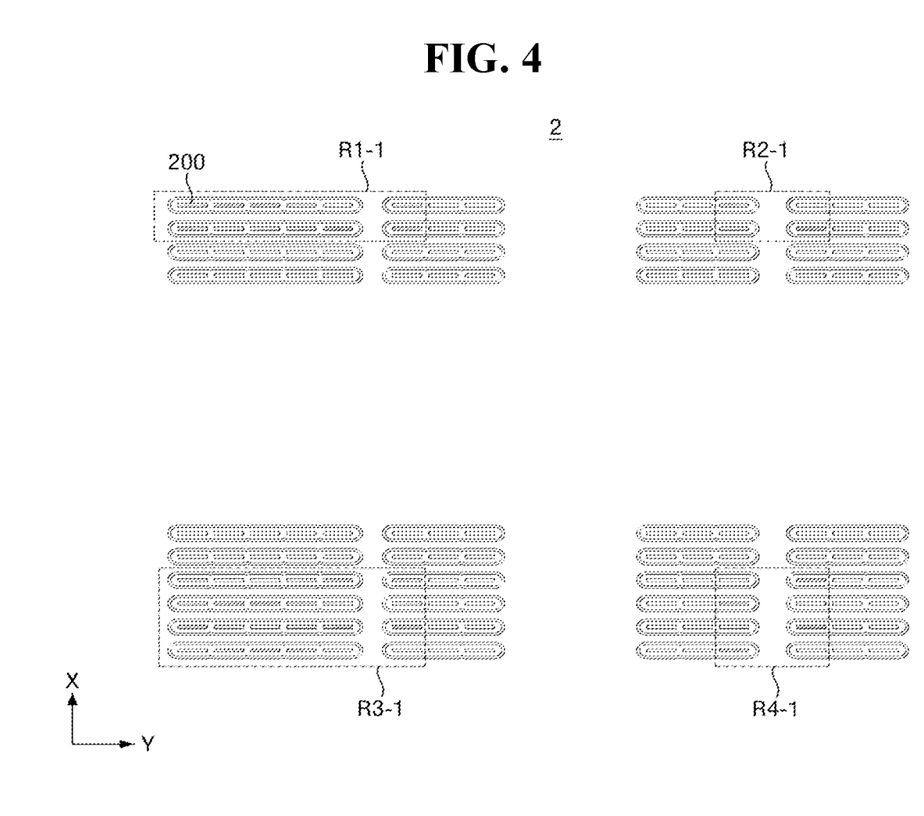
FIG. 4 illustrates patterns obtained after performing the lithography on some patterns extracted according to the optical proximity correction method in accordance with some embodiments.

FIG. 4 illustrates patterns obtained after performing the lithography on some of the preliminary target patterns 100, e.g., on the extracted preliminary target patterns 100 of FIG. 3, according to the OPC method in accordance with some embodiments.

Referring to FIG. 4, the lithography is performed on each of the first region R1, the second region R2, the third region R3, and the fourth region R4 having the same unique patterns among the preliminary patterns 1 including the preliminary target patterns 100 of FIG. 3. Through the lithography, a first-first region R1-1, a second-first region R2-1, a third-first region R3-1 and a fourth-first region R4-1 having the resultant target patterns 200 subjected to the lithography may be formed.

Accordingly, a run time of the lithography may be reduced, e.g., due to performance of lithography on extracted patterns rather than all patterns, and uniformity of the patterns subjected to the lithography may also be improved. In addition, the resources used for performing the lithography may also be decreased.

Hereinafter, the optical proximity correction method according to some embodiments will be described in detail.

Figure 5:
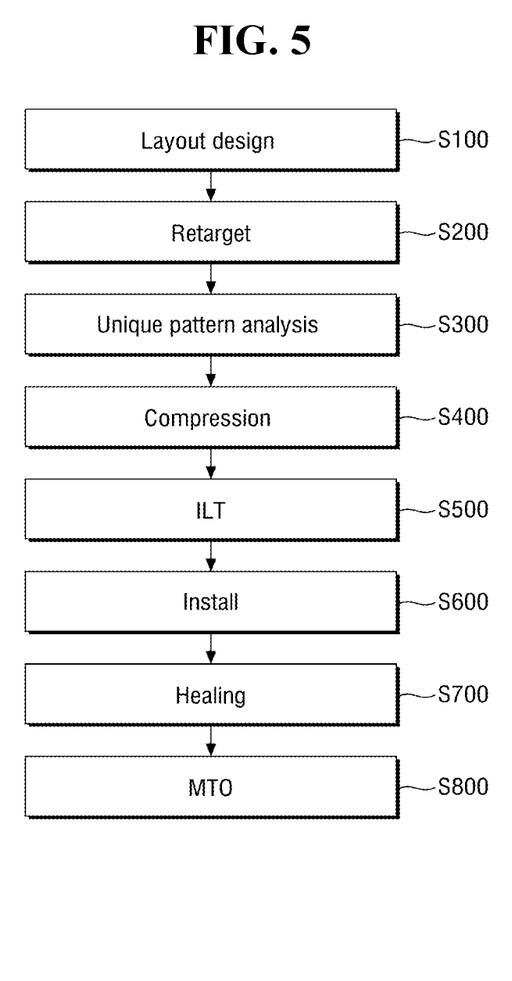
FIG. 5 is a flowchart showing a method of fabricating a mask including the optical proximity correction method according to some embodiments.
Figure 6:
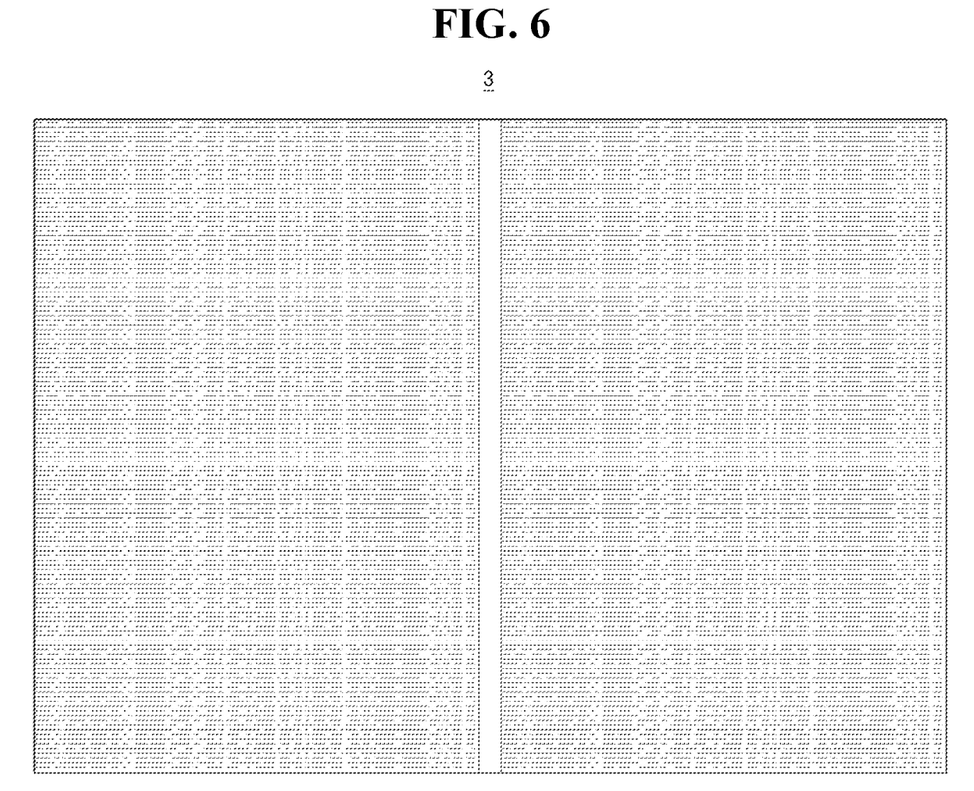
FIG. 6 illustrates operation S300 of FIG. 5.
Figure 7:
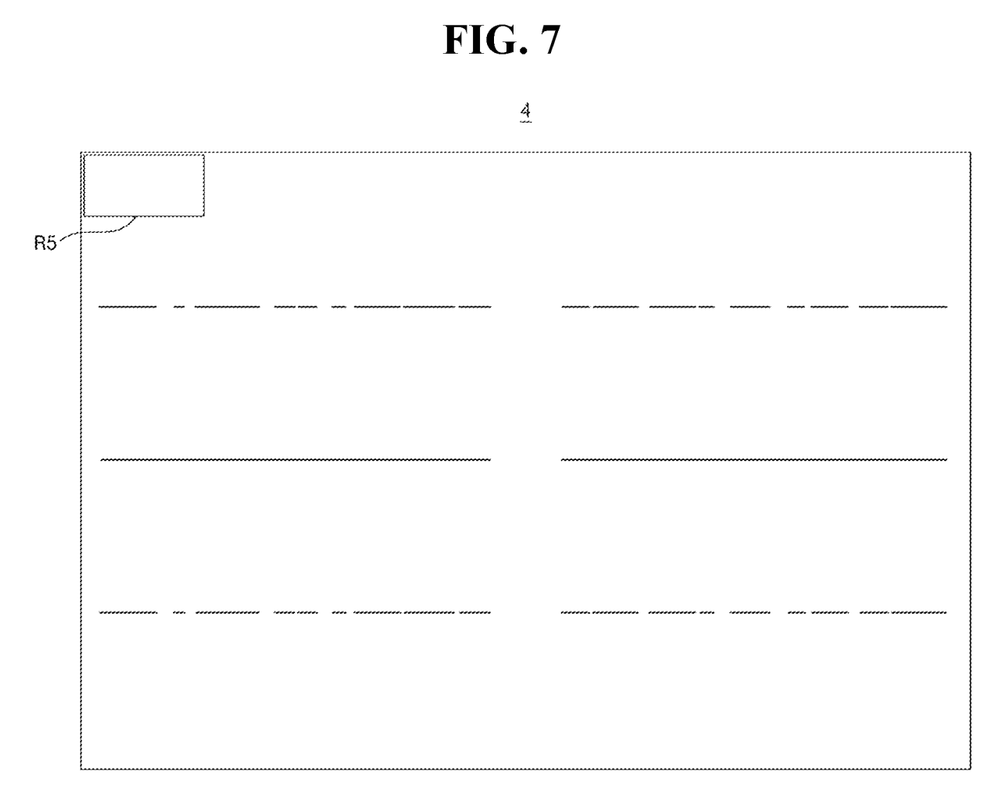
FIG. 7 illustrates operation S400 of FIG. 5.
Figure 8:
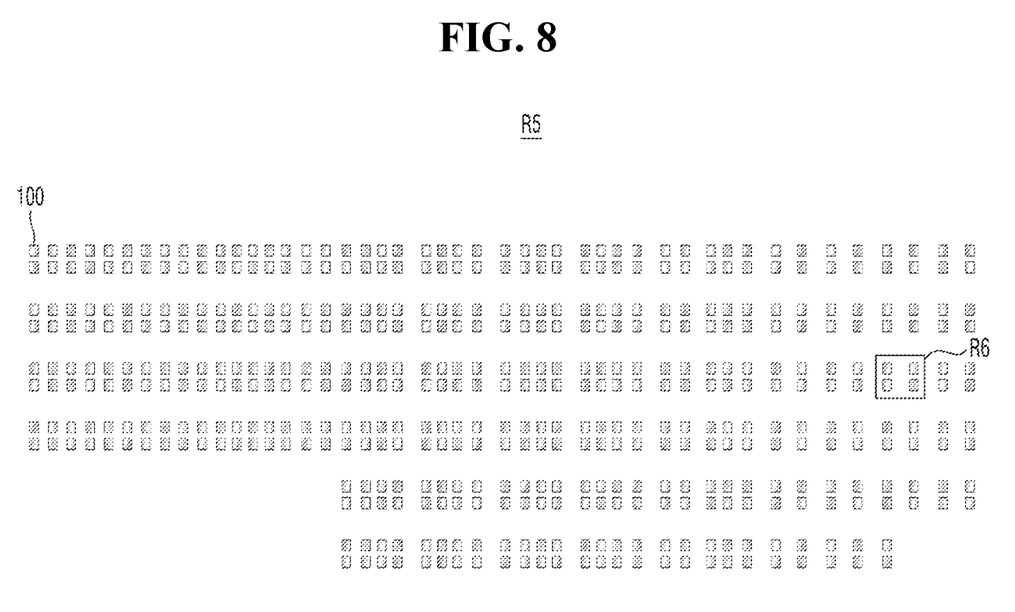
FIG. 8 is an enlarged view of region R5 of FIG. 7.
Figure 9:
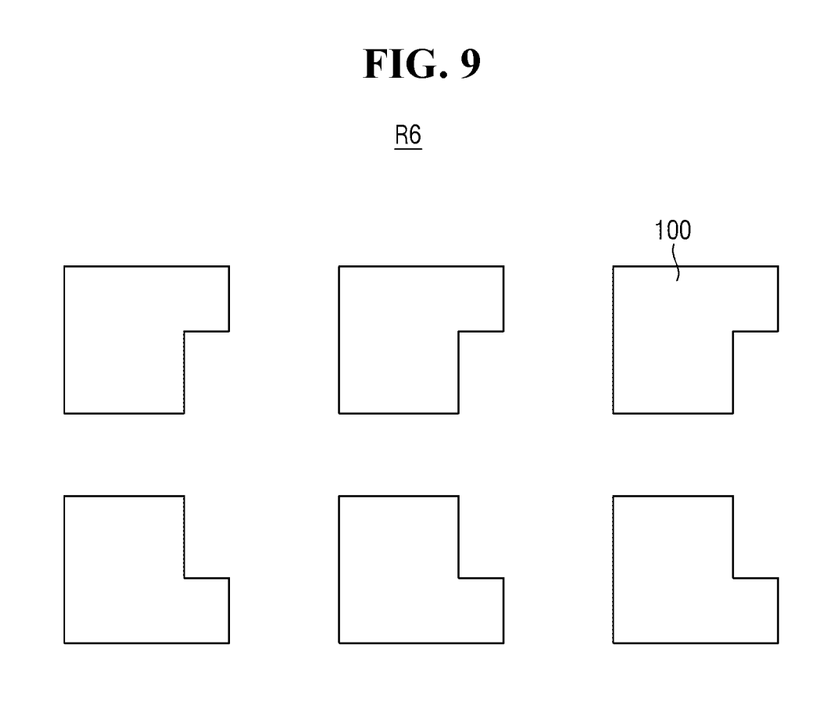
FIG. 9 is an enlarged view of region R6 of FIG. 8.
Figure 10:
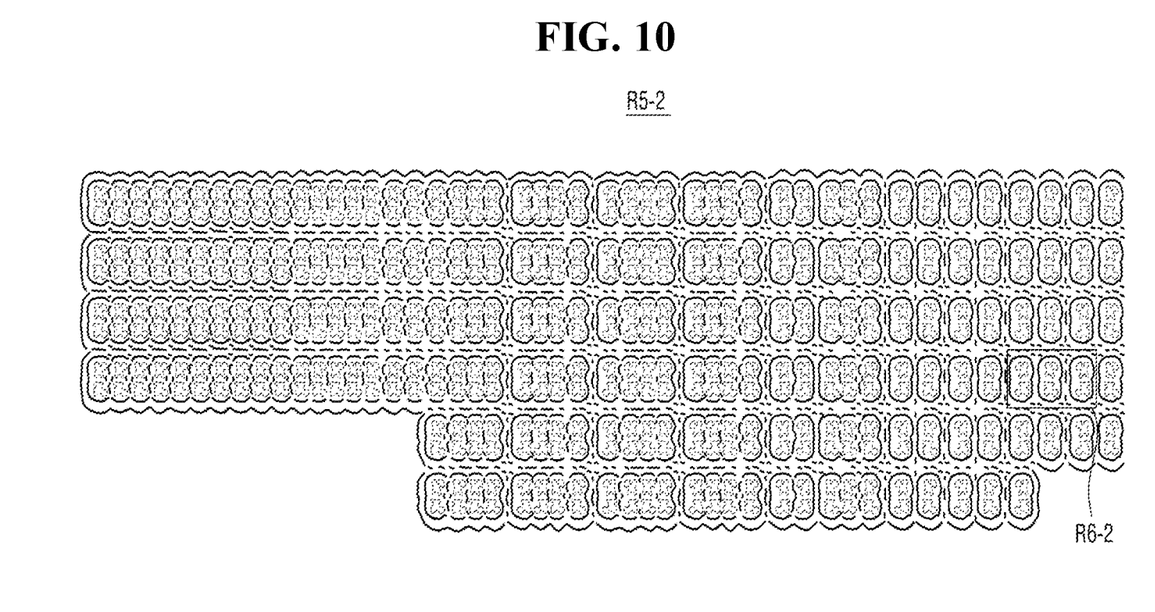
FIG. 10 illustrates operation S500 of FIG. 5.
Figure 11:
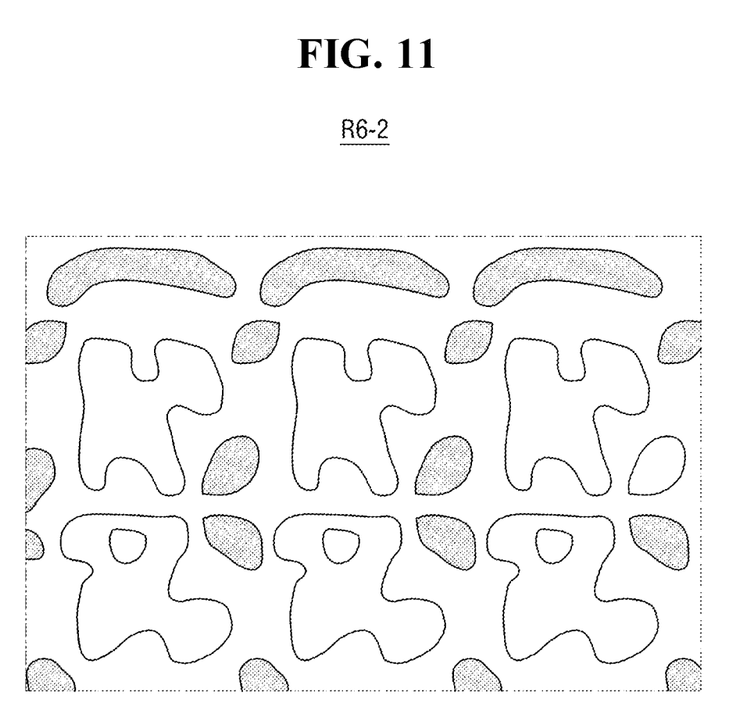
FIG. 11 is an enlarged view of region R6-2 of FIG. 10.

FIG. 5 is a flowchart showing a method of fabricating a mask including the OPC method according to some embodiments. FIG. 6 illustrates operation S300 of FIG. 5, FIG. 7 illustrates operation S400 of FIG. 5, FIG. 8 is an enlarged view of region R5 of FIG. 7, FIG. 9 is an enlarged view of region R6 of FIG. 8, FIG. 10 illustrates operation S500 of FIG. 5, FIG. 11 is an enlarged view of region R6-2 of FIG.

Figure 12:
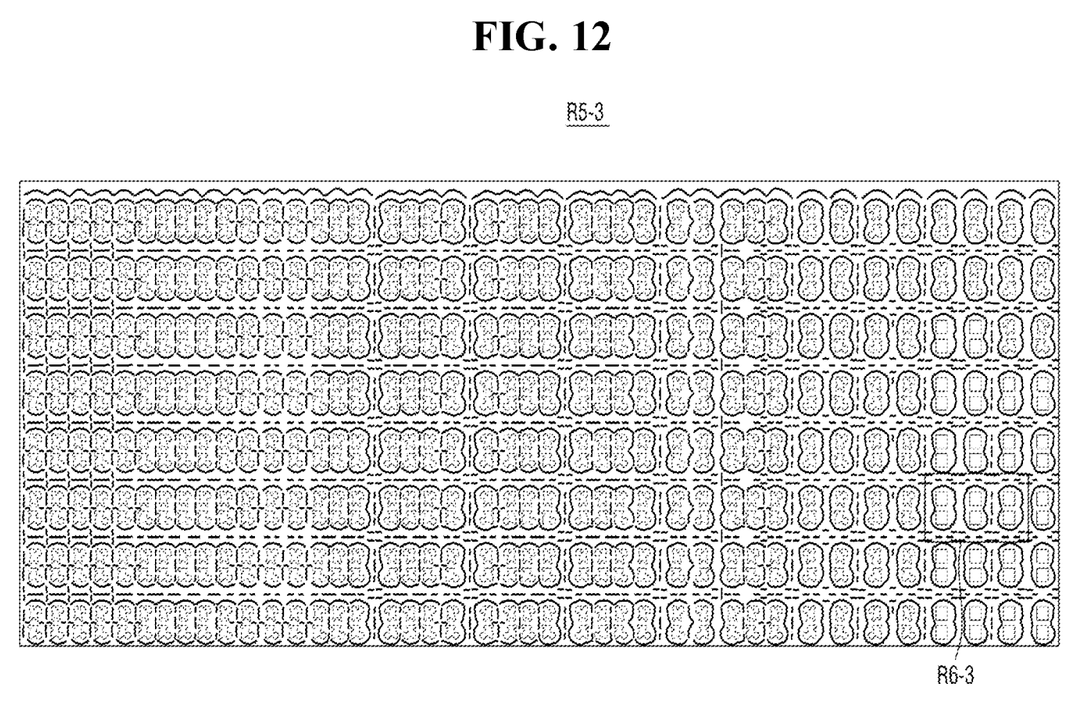
FIG. 12 illustrates operation S600 of FIG. 5.
Figure 13:
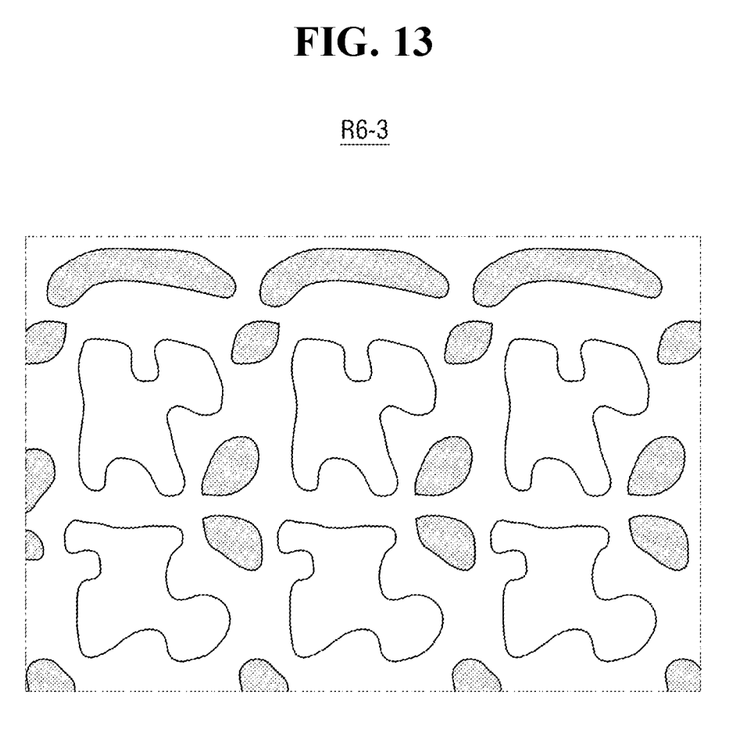
FIG. 13 is an enlarged view of region R6-3 of FIG. 12.

10, FIG. 12 illustrates operation S600 of FIG. 5, and FIG. 13 is an enlarged view of region R6-3 of FIG. 12.

Referring to FIGS. 5 to 13, a layout design may be provided first (operation S100), e.g., a layout of the preliminary target patterns 100 in FIG. 1. Thereafter, targets in the designed layout may be determined (operation S200), e.g., respective regions having repeated unique patterns may be determined among the preliminary target patterns 100 as described with reference to FIG. 3.

Then, the same, e.g., repeated, unique patterns may be analyzed by the OPC method according to some embodiments (operation S300). For example, repeated unique patterns may be analyzed with respect to a designed layout 3 of FIG. 6. At this time, the size of a region in which unique patterns are determined may be determined arbitrarily.

Subsequently, the area of the same unique patterns analyzed is compressed (operation S400). The result obtained by compressing the area of a portion having the same unique patterns with respect to the designed layout 3 of FIG. 6 corresponds to patterns 4 of FIG. 7. For example, the compression ratio may be 0.2% of the original area.

For example, a fifth region R5 in FIG. 7 among the compressed portions will be described with reference to the enlarged view in FIG. 8. As illustrated in FIG. 8, in the fifth region R5, the preliminary target patterns 100 (i.e., before undergoing lithography) may be disposed. For example, an enlarged view of a part (e.g., a sixth region R6) of the fifth region R5 is illustrated in FIG. 9. That is, layouts having the same unique patterns may exist in the fifth region R5 before performing the lithography, as seen in the enlarged view of the sixth region R6 of FIG. 9.

Next, lithography is performed only on the portions having the same unique patterns (e.g., the fifth region R5), whose area has been compressed in operation S400 (operation S500). A state after performing the lithography on the portions (e.g., the fifth region R5) having the same unique patterns, whose area has been compressed in operation S400, is shown in FIG. 10.

In a fifth-second region R5-2 including target patterns subjected to the lithography, as illustrated in FIG. 10, the original shapes of the layout patterns of the sixth region R6 (illustrated in FIG. 9) may be deformed. For example, the sixth region R6 of FIG. 9 (i.e., before lithography) may be transformed by the lithography into a sixth-second region R6-2 as a part of the fifth-second region R5-2 in FIG. 10. The sixth-second region R6-2 will be explained in more detail below with reference to FIG. 11.

FIG. 11 illustrates an enlarged view of the sixth-second region R6-2 of FIG. 10. The deformed target patterns subjected to the lithography may be formed as patterns for the OPC as in the enlarged view of the sixth-second region R6-2.

Subsequently, lithography is performed to a portion in which the portion subjected to the lithography is repeated, the lithography having been performed only for the same unique patterns (operation S600). Consequently, the lithography may be performed on all of the portions where the unique pattern is repeated as in a fifth-third region R5-3 of FIG. 12. An enlarged view of a sixth-third region R6-3 as a part of the fifth-third region R5-3 is illustrated in FIG. 13. For example, the portion of repeated patterns, i.e., the extracted patterns, having undergone lithography and OPC may be formed, e.g., implemented, in the remaining pattern layout, e.g., "install" part indicated in operation S600 of FIG. 5.

Thereafter, lithography may successively be performed on some repeated patterns, and on the entire region. Then, healing (i.e., correction) may be performed on all of the patterns (operation S700).

Here, the healing may check whether the patterns violate a mask rule check or not, e.g., in accordance with predetermined standards. Additionally or separately, main healing may be performed to reduce an edge placement error (EPE), e.g., in accordance with any suitable technique. The healing is not limited thereto, and various types of healing may be performed.

Finally, a mask tape-out (MTO) is performed (operation S800). For example, the MTO may indicate transferring final mask data, on which OPC is completed, to a mask manufacturing team to request to manufacture a mask. For example, a substrate for a mask may be exposed based on the final mask data, e.g., via an electron beam writing operation, to form the mask. After the exposure process, the mask is manufactured by performing a series of processes on the exposed substrate, e.g., development, etching, and cleansing processes.

The methods, processes, and/or operations described herein (e.g., extracting, comparing, of patterns) may be performed by code or instructions to be executed by a computer, processor, controller, or other signal processing device (e.g., via a simulation to be implemented when processing physical layers on a substrate). The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

By way of summation and review, in a mask manufacturing process, a desired circuit may be first designed, a layout of the circuit may be designed, and design data obtained through OPC may be delivered as MTO design data. Subsequently, a mask data preparation (MDP) process may be performed based on the MTO design data, and a mask may be manufactured.

In order to secure high yield and characteristics of a semiconductor device, it is important to improve CD uniformity of patterns formed on a wafer. A method of improving the CD uniformity in a field by adjusting light transmittance for a corresponding portion of a mask, i.e., a photomask, using CD data extracted from the wafer patterns has been used. The light transmittance for a specific area of the photomask may be adjusted, e.g., corrected, using a laser based on a measurement position information and the measured CD data in the field obtained from the wafer. In this case, an approximate correction is performed by sorting data on predetermined transmittance adjustment unit areas. However, in this method for correcting the light transmittance for the photomask, since corrections are collectively performed without consideration of various layouts existing in all of the fields in the photomask, an accurate correction cannot be made and its application is limited.

In contrast, aspects of the present disclosure provide an optical proximity correction method with improved operation efficiency. Aspects of the present disclosure also provide a method of fabricating a mask including an optical proximity correction method with improved operation efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical proximity correction method performed by code or instructions to be executed by a computer, the method comprising:
   extracting only first patterns from a pattern mask, the first patterns being a subset of unique repeated patterns of all patterns of the pattern mask;
   analyzing and compressing an area of the extracted first patterns;
   performing lithography only on the extracted first patterns with the compressed area among all patterns in the pattern mask to form first-first patterns;
   forming the first-first patterns in the pattern mask at positions where the first patterns were formed, such that the pattern mask includes the first-first patterns among non-extracted patterns;
   performing correction on the pattern mask including the first-first patterns among non-extracted patterns; and
   checking whether patterns of the pattern mask violate a mask rule check.

2. The optical proximity correction method as claimed in claim 1, wherein the first patterns are the same patterns.

3. The optical proximity correction method as claimed in claim 2, wherein performing lithography includes performing lithography only on one of the first patterns.

4. The optical proximity correction method as claimed in claim 1, wherein performing correction includes reducing an edge placement error (EPE).

5. The optical proximity correction method as claimed in claim 1, wherein performing lithography includes performing inverse lithography technology (ILT).

6. An optical proximity correction method performed by code or instructions to be executed by a computer, the method comprising:
   extracting only first patterns and second patterns from a pattern mask, the first and second patterns being subsets of unique repeated patterns of all patterns of the pattern mask;
   analyzing and compressing areas of the extracted first and second patterns;
   performing lithography only on the extracted first and second patterns with the compressed areas among all patterns in the pattern mask to form first-first patterns and second-first patterns, respectively;
   forming the first-first patterns in the pattern mask at positions where the first patterns were formed;
   forming the second-first patterns in the pattern mask at positions where the second patterns were formed;
   performing correction on the pattern mask including the first-first patterns and the second-first patterns among non-extracted patterns; and
   checking whether patterns of the pattern mask violate a mask rule check.

7. The optical proximity correction method as claimed in claim 6, wherein the first patterns are the same patterns.

8. The optical proximity correction method as claimed in claim 7, wherein performing lithography includes performing lithography only on one of the first patterns.

9. The optical proximity correction method as claimed in claim 6, wherein the second patterns are the same patterns.

10. The optical proximity correction method as claimed in claim 9, wherein performing lithography includes performing lithography only on one of the second patterns.

11. The optical proximity correction method as claimed in claim 6, wherein the first patterns are different from the second patterns.

12. The optical proximity correction method as claimed in claim 6, wherein performing correction includes reducing an edge placement error (EPE).

13. The optical proximity correction method as claimed in claim 6, wherein performing the lithography includes performing inverse lithography technology (ILT).

14. A method of fabricating a mask comprising:
   producing a pattern mask with a designed layout;
   performing lithography only on first patterns in the pattern mask to form first-first patterns, the first patterns being a subset of unique repeated patterns having compressed area of all patterns of the pattern mask;
   forming the first-first patterns in the pattern mask at positions where the first patterns were formed, such that the pattern mask includes the first-first patterns among non-lithographed patterns;
   performing a correction on the pattern mask including the first-first patterns among non-extracted patterns to correct an optical proximity effect, the correction being performed by code or instructions to be executed by a computer;
   checking whether patterns of the pattern mask violate a mask rule check; and
   performing a mask tape-out (MTO) on the pattern mask in which the optical proximity effect has been corrected.

15. The method of fabricating a mask claim 14, wherein the first patterns are the same patterns.

16. The method of fabricating a mask claim 15, wherein performing lithography includes performing lithography only on one of the first patterns.

17. The method of fabricating a mask claim 14, wherein performing correction includes reducing an edge placement error (EPE).

18. The method of fabricating a mask claim 14, wherein performing lithography includes performing inverse lithography technology (ILT).

* * * * *